US012738924B2

(12) United States Patent
Toivanen

(10) Patent No.: US 12,738,924 B2

(45) Date of Patent: Sep. 15, 2026

(54) FUSE CAPACITOR ELECTROSTATIC DISCHARGE (ESD) PROTECTION FOR ELECTROACOUSTIC DEVICES

(71) Applicant: QUALCOMM Incorporated, San Diego, CA (US)

(72) Inventor: Lasse Jalmari Toivanen, Espoo (FI)

(73) Assignee: QUALCOMM Incorporated, San Diego, CA (US)

( * ) Notice: Subject to any disclaimer, the term of this patent is extended or adjusted under 35 U.S.C. 154(b) by 443 days.

(21) Appl. No.: 18/520,187

(22) Filed: Nov. 27, 2023

(65) Prior Publication Data

US 2025/0175159 A1 May 29, 2025

(51) Int. Cl.

*H03H 9/64* (2006.01)
*H03H 9/02* (2006.01)
*H03H 9/72* (2006.01)

(52) U.S. Cl.

CPC ...... *H03H 9/6489* (2013.01); *H03H 9/02984* (2013.01); *H03H 9/6433* (2013.01); *H03H 9/725* (2013.01)

(58) Field of Classification Search

CPC .................. H03H 9/64–6496; H03H 9/02984

See application file for complete search history.

(56) References Cited

U.S. PATENT DOCUMENTS 3,638,083 A * 1/1972 Dornfeld .................. H01G 2/14 361/321.1
7,282,835 B2 10/2007 Kawakami
10,277,198 B2 * 4/2019 Lear ....................... H03H 9/542
10,541,713 B2 * 1/2020 Ni ........................... H04B 1/18
2001/0029650 A1 * 10/2001 Takata ..................... H03H 3/10 29/25.35
2017/0033029 A1 2/2017 Ritter et al.
2020/0304103 A1 * 9/2020 Kawasaki ............ H03H 9/6483
2022/0247385 A1 * 8/2022 Esquius Morote .... H03H 9/605

FOREIGN PATENT DOCUMENTS

CN 1322059 A 11/2001

OTHER PUBLICATIONS

International Search Report and Written Opinion—PCT/US2024/054731—ISA/EPO—Mar. 7, 2025.

* cited by examiner

*Primary Examiner* — Thienvu V Tran

*Assistant Examiner* — Christopher J Clark

(74) *Attorney, Agent, or Firm* — Patterson + Sheridan LLP

(57) ABSTRACT

Certain aspects of the present disclosure are directed towards an electroacoustic device and techniques for fabricating the same. An example electroacoustic device may include: an acoustic resonator, a first capacitive element including a first terminal coupled to a first terminal of the acoustic resonator and a second terminal coupled to a first node of the electroacoustic device, and first solder shorting the first terminal and the second terminal of the first capacitive element.

20 Claims, 6 Drawing Sheets

Figure 6:
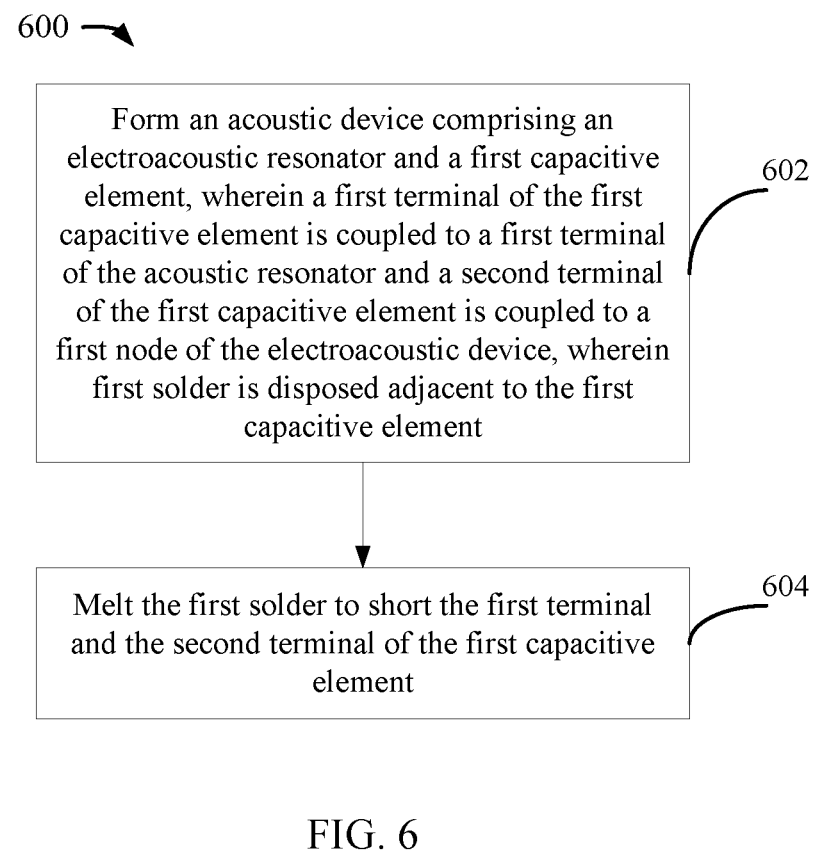

600

Form an acoustic device comprising an electroacoustic resonator and a first capacitive element, wherein a first terminal of the first capacitive element is coupled to a first terminal of the acoustic resonator and a second terminal of the first capacitive element is coupled to a first node of the electroacoustic device, wherein first solder is disposed adjacent to the first capacitive element

602

Melt the first solder to short the first terminal and the second terminal of the first capacitive element

FUSE CAPACITOR ELECTROSTATIC DISCHARGE (ESD) PROTECTION FOR ELECTROACOUSTIC DEVICES

TECHNICAL FIELD

Certain aspects of the present disclosure generally relate to electroacoustic devices, and more particularly, to an electroacoustic device implemented with electrostatic discharge (ESD) protection.

BACKGROUND

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include one or more filters, which may be implemented using an electroacoustic element such as a double-mode surface acoustic wave (DMS) filter.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards an electroacoustic device. The electroacoustic device generally includes an acoustic resonator, a first capacitive element including a first terminal coupled to a first terminal of the acoustic resonator and a second terminal coupled to a first node of the electroacoustic device, and first solder shorting the first terminal and the second terminal of the first capacitive element.

Certain aspects of the present disclosure are directed towards a method for device manufacturing. The method generally includes: forming an electroacoustic device comprising an acoustic resonator and a first capacitive element, wherein a first terminal of the first capacitive element is coupled to a first terminal of the acoustic resonator and a second terminal of the first capacitive element is coupled to a first node of the electroacoustic device, wherein first solder is disposed adjacent to the first capacitive element; and melting the first solder to short the first terminal and the second terminal of the first capacitive element.

Certain aspects of the present disclosure are directed towards an apparatus for wireless communication. The apparatus generally includes an amplifier, an antenna switch module (ASM), and an acoustic filter coupled between the amplifier and the ASM. The acoustic filter generally includes an acoustic resonator; a first capacitive element including a first terminal coupled to a first terminal of the acoustic resonator and a second terminal coupled to a first node of the acoustic filter, the first node being coupled to the amplifier or the ASM; and first solder shorting the first terminal and the second terminal of the first capacitive element.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIG. 6 is a flow diagram illustrating example operations for device manufacturing, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to an electroacoustic device implemented with electrostatic discharge (ESD) protection and techniques for fabricating the same. The electroacoustic device may include an acoustic resonator (e.g., a double-mode surface acoustic wave (DMS) filter). Before the electroacoustic device is integrated into a wireless device, the resonator may be vulnerable to damage from ESD. Once assembled into the wireless device, the resonator may be protected by, for example, an antenna switch module (ASM) and a low-noise amplifier (LNA) of the wireless device. To protect the resonator prior to assembly in the wireless device, capacitive elements may be coupled to respective resonator terminals, as described in more detail herein. In some aspects, the capacitive elements may be implemented using interdigital transducers (IDTs). Solder (e.g., solder paste) may be disposed adjacent to each capacitive element. Once assembled in the wireless device, the solder may be melted (e.g., reflow), shorting the terminals (e.g., the IDT fingers) of the capacitive elements so that the capacitive elements do not interfere with the operation of the resonator.

Example Wireless Communications

Figure 1:
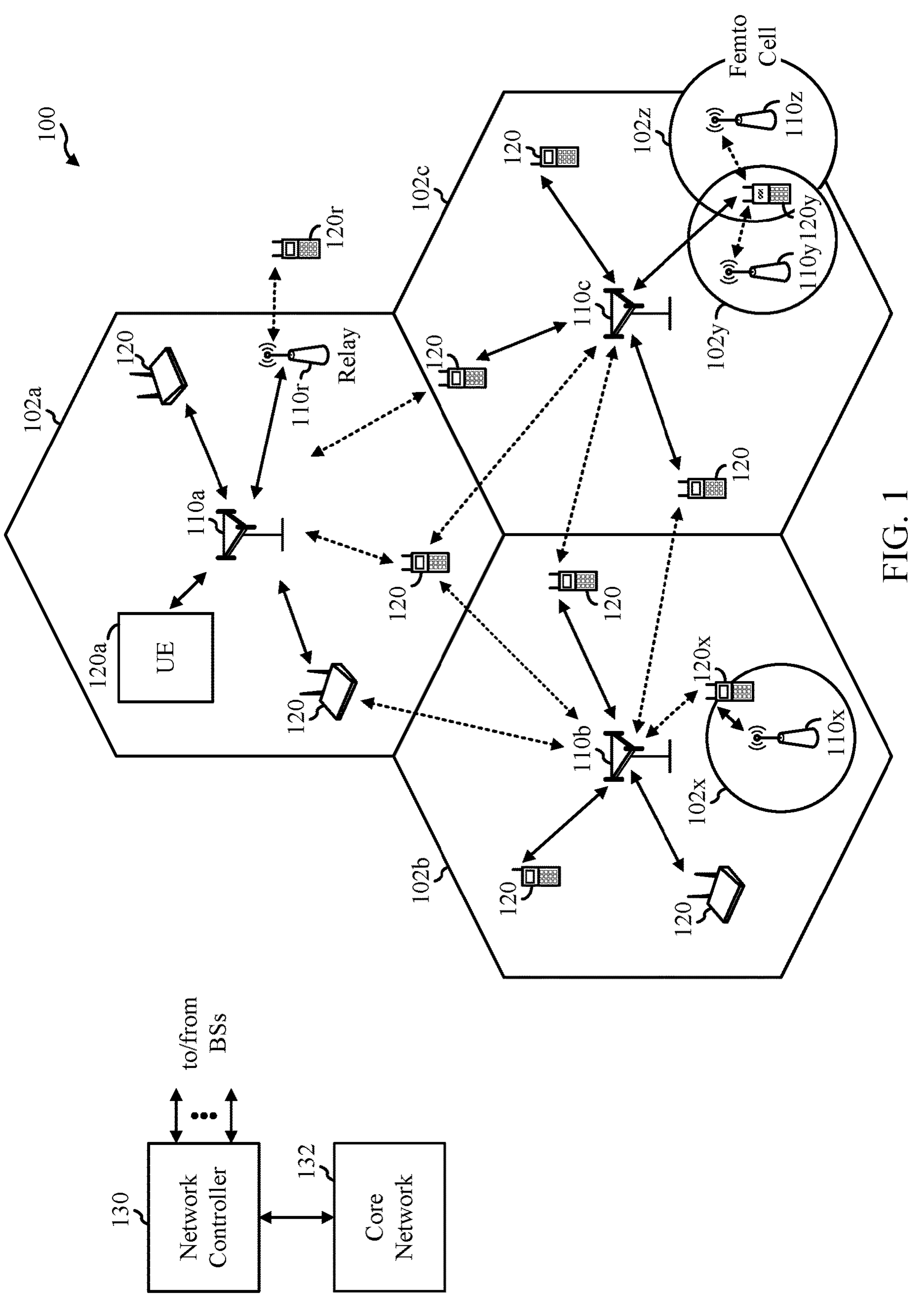
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipments (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. Nup UEs may be selected for simultaneous transmission on the uplink, Ndn UEs may be selected for simultaneous transmission on the downlink. Nup may or may not be equal to Ndn, and Nup and Ndn may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include one or more filters implemented with ESD protection, as described in more detail herein.

Figure 2:
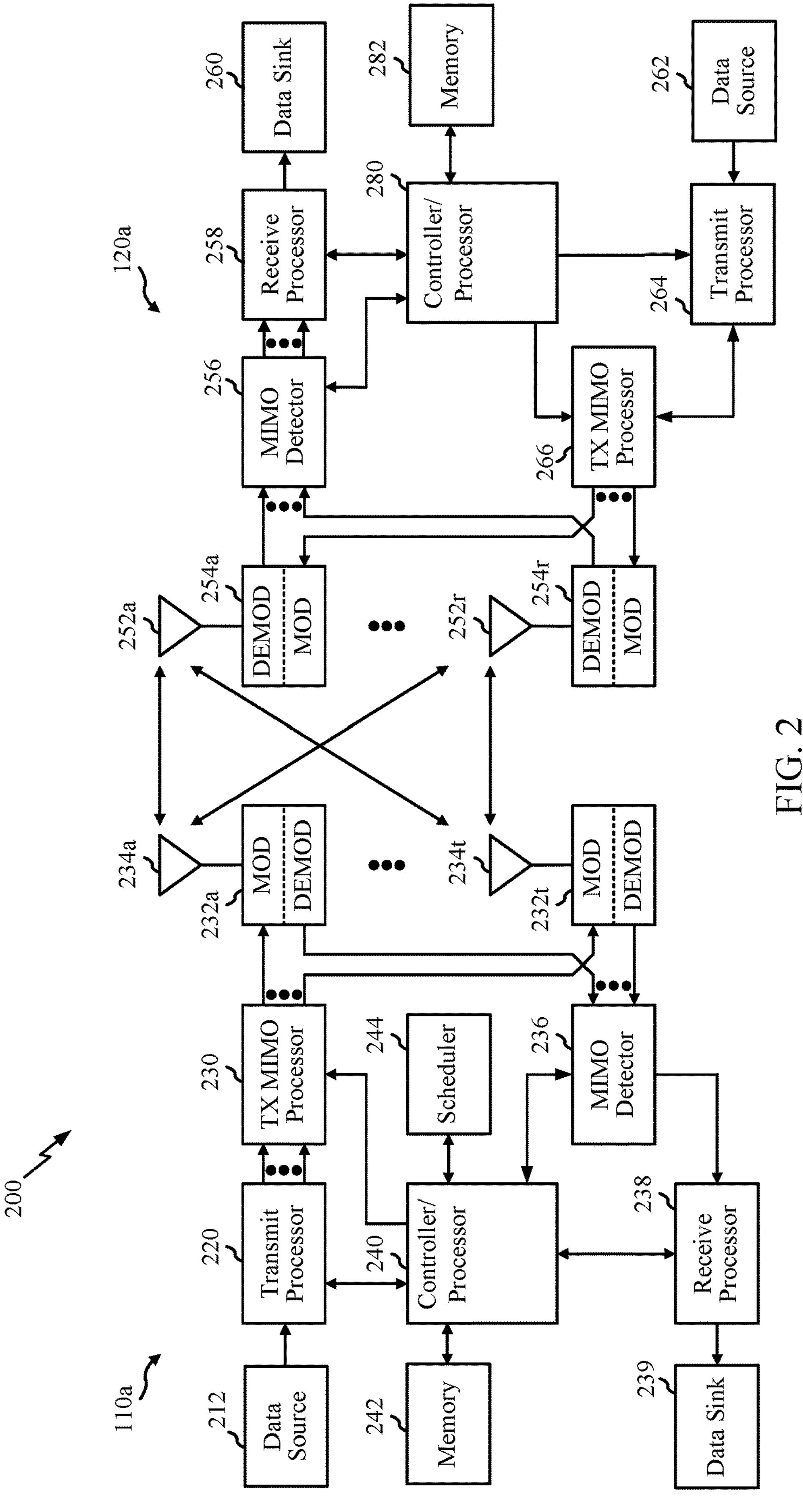
FIG. 2 is a block diagram of an example base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120*a* and/or antennas 234, processors 220, 230, 238, and/or controller/processor 240 of the BS 110*a* may be used to perform the various techniques and methods described herein.

In certain aspects of the present disclosure, the transceivers 232 and/or the transceivers 254 may include one or more filters implemented with ESD protection, as described in more detail herein.

Example RF Transceiver

Figure 3:
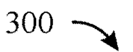
FIG. 3 is a block diagram of an example radio frequency (RF) transceiver, in which aspects of the present disclosure may be practiced.
Figure 3:
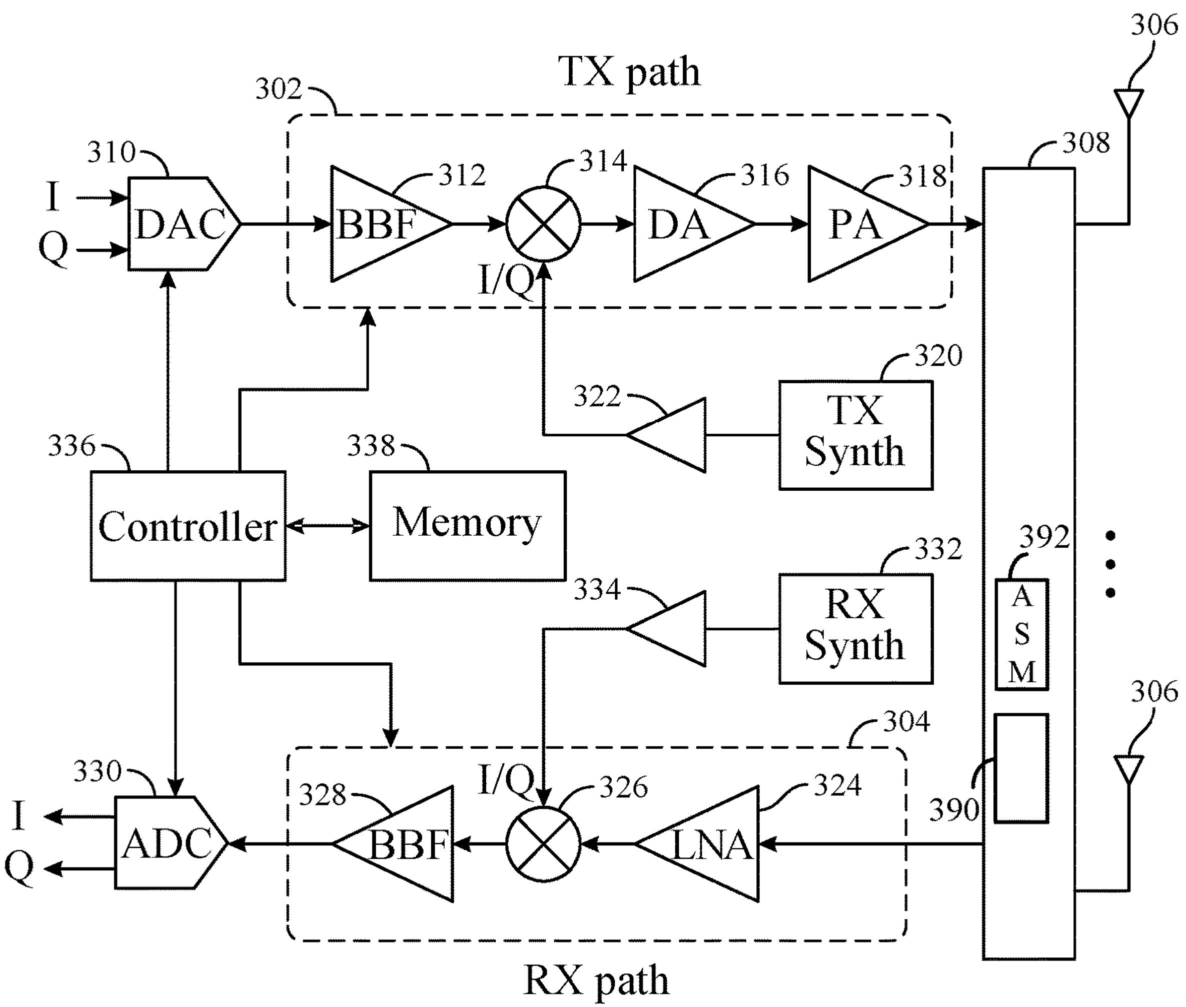

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

In some aspects, one or more filters (e.g., in the interface 308) may be implemented with ESD protection, as described in more detail herein. For example, a filter 390 may be coupled between the LNA 324 and a portion of the interface 308 (e.g., an antenna switch module (ASM) 392), which may be ESD protected.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for ESD protection in any of various other suitable systems.

Example Fused Capacitor for Electrostatic Discharge (ESD) Protection

Some components are sensitive to electrostatic discharge (ESD), which makes it challenging to use such components in a module environment. ESD damaging a component may occur during manufacturing, such as during component pick and placement and in a baking assembly. Once the component is assembled into a module, the ESD-sensitive component may be protected from ESD by other components, such as an antenna switch module (ASM) (e.g., at an input side of the component) and a low-noise amplifier (LNA) and switch at the output side of the component.

Bump solder leakage may occur when the size of a solder resist layer is insufficient at the solder bump. Once the solder leaks into a component layout (e.g., interdigital transducer (IDT) fingers of a filter), it is likely to cause a signal short for the component, degrading the performance of the component (e.g., the filter). Certain aspects of the present disclosure are directed towards using a capacitive element to protect a component against ESD and take advantage of solder leakage to short the capacitive element after assembly of the component on a module. Once the component (e.g., an acoustic filter) has been assembled into a module and is protected from ESD by other components, solder leakage may be used to short out the capacitive element so the capacitive element does not impact the operation of the component being protected. In some cases, the capacitance value of the capacitive element may be considered when analyzing measurement results to facilitate testing of component performance. In other words, prior to the capacitive element being shorted, the impact of the capacitive element on the filter performance may be considered when analyzing measurement results. In some aspects, an absorber structure may be used to avoid the solder leaking into the capacitive element during filter assembly, as described in more detail herein.

Figure 4A:
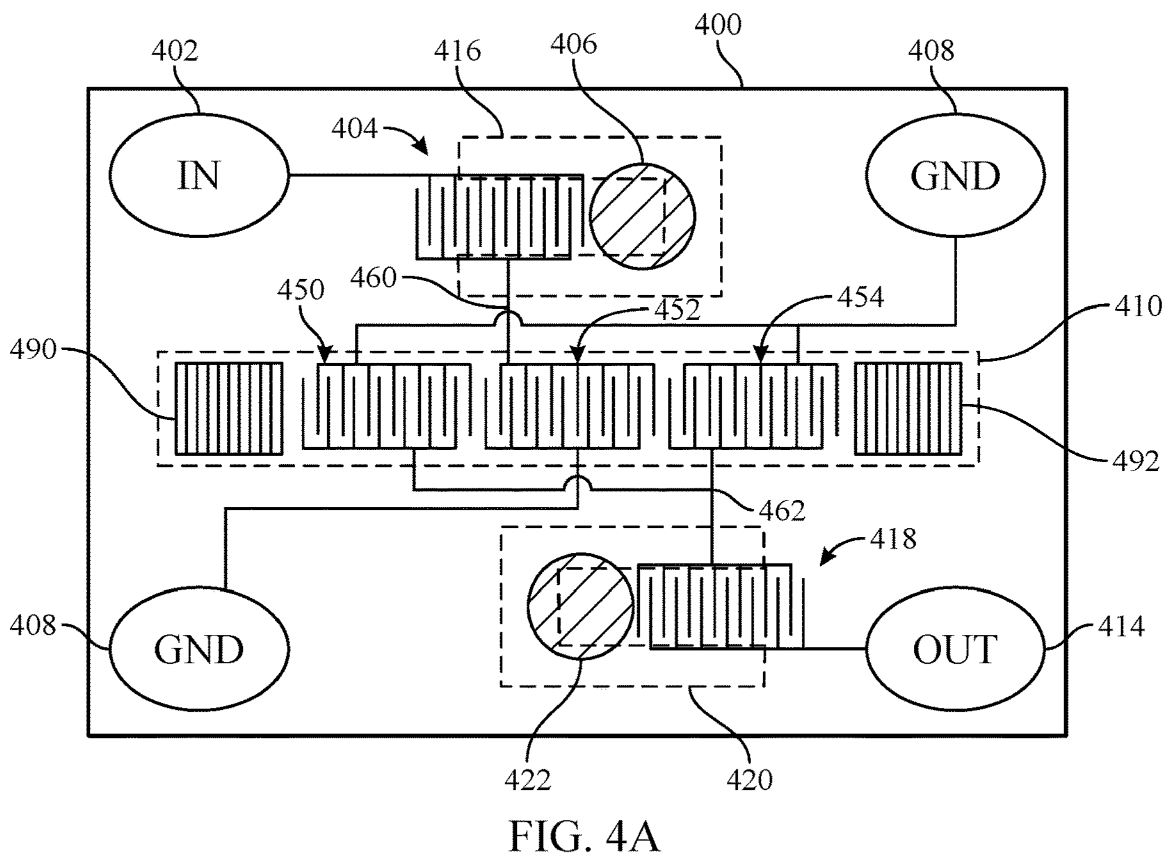
FIGS. 4A and 4B illustrate a top view of an example filter module including an electrostatic discharge (ESD)-protected double-mode surface acoustic wave (DMS) filter, in accordance with certain aspects of the present disclosure.
Figure 4B:
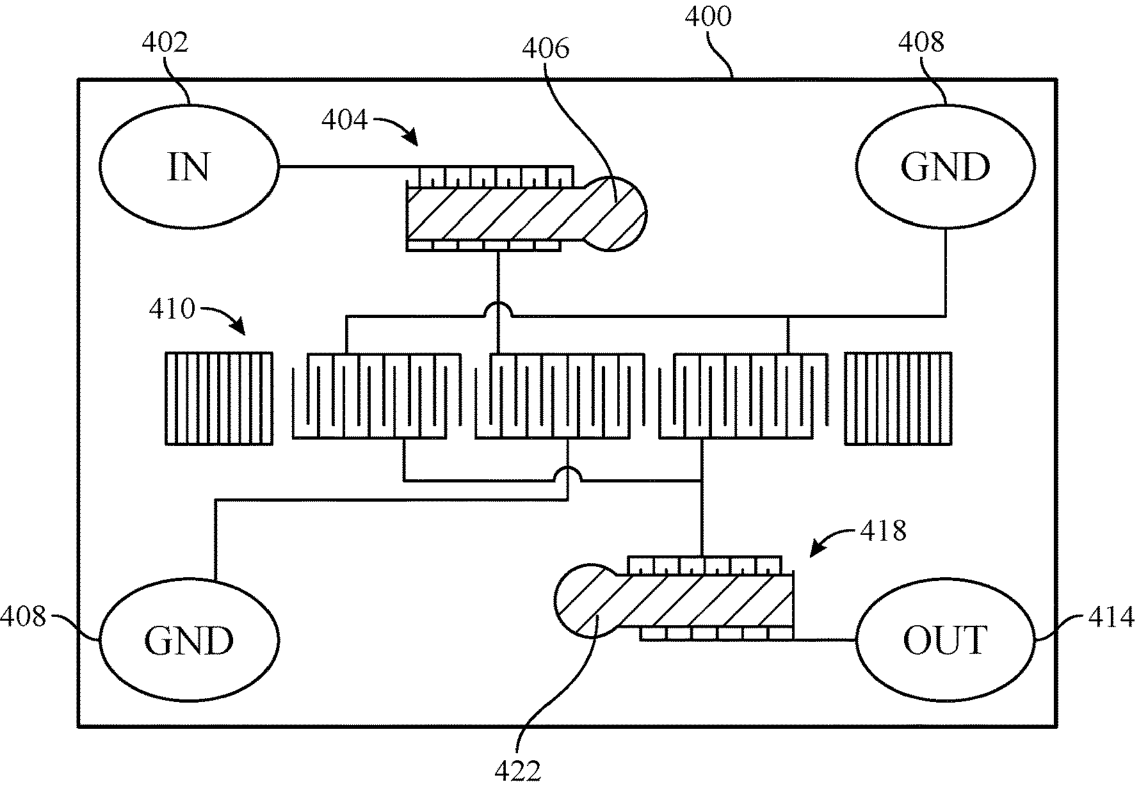

FIGS. 4A and 4B illustrate a filter module 400 including an ESD-protected double-mode surface acoustic wave (DMS) filter 410, in accordance with certain aspects of the present disclosure. FIG. 4A shows the filter module 400 prior to a solder reflow process, and FIG. 4B shows the filter module 400 after a solder reflow process. As shown in FIG. 4A, the DMS filter 410 may include interdigital transducers (IDTs) 450, 452, 454, which may be between reflectors 490, 492. As shown, each of the IDTs 450, 454 may have a first terminal coupled to an electrical ground node 408 (e.g., labeled "GND") and a second terminal coupled to an output node 462 of the filter 410, as shown. The IDT 452 may have a first terminal coupled to an input node 460 of the filter 410 and a second terminal coupled to the electrical ground node 408. As shown, the input node 460 of the filter 410 is coupled to an input node 402 of the module 400 through a capacitive element 404, which may be implemented using an IDT. Similarly, the output node 462 of the filter 410 may be coupled to output node 414 of the module 400 through a capacitive element 418, which may be implemented using an IDT. An IDT may include interdigitated fingers that are attached to opposite busbars, as shown. In some aspects, the direction of the interdigitated fingers used to implement capacitive element 404 and/or capacitive element 418 may be different than shown in FIG. 4. For example, the interdigitated fingers for capacitive element 404 and/or capacitive element 418 may be 90° relative to the direction of fingers of the interdigitated fingers used to implement the DMS filter 410.

In some aspects, a solder resist region 416, 420 may be implemented adjacent to one or more sides of each of the capacitive elements 404, 418, respectively. The solder resist region may be used to direct a flow of solder when melted towards a respective capacitive element. For example, the solder resist region 416 may be implemented adjacent to the capacitive element 404 and solder 406 (e.g., a solder bump). The solder resist region 416 may have a "U" shape with an opening towards the capacitive element 404 so that solder 406 is directed towards the capacitive element 404 when melted. As shown, the solder resist region 420 may be implemented adjacent to the capacitive element 418 and solder 422 (e.g., a solder bump). As shown in FIG. 4B, once the solder 406 has melted, the reflowed solder migrates towards the capacitive element 404. Similarly, once the solder 422 has melted, the reflowed solder migrates toward the capacitive element 418. Thus, the DMS filter 410 may be ESD protected by the capacitive elements 404, 418 until the filter module 400 is assembled in a device (e.g., onto a printed circuit board (PCB) of a wireless device or module), at which point, the solder 406 and solder 422 may be heated and melted to short out the capacitive elements 404, 418 (e.g., short the IDT fingers thereof).

Series resonators may be used at the input and output of a DMS filter for ESD protection. The resonators add losses to the DMS filter and consume space. Design constraints for IDTs used to implement the capacitive elements 404, 418 may be less stringent as compared to an acoustic resonator (e.g., with respect to aperture and count of IDT fingers). Thus, the capacitive elements 404, 418 may be made smaller, reducing filter size as compared to other implementations using series resonators. Moreover, losses of the DMS filter may be reduced since aspects of the present disclosure may not include resonators coupled in series with the DMS filter and the capacitive elements used for ESD protection are shorted out via solder. The fuse solder bump (e.g., for solder 406 or solder 422) may be shorter and smaller than other solder bumps for filters so that the fuse solder bump does not contact a module laminate.

Figure 5A:
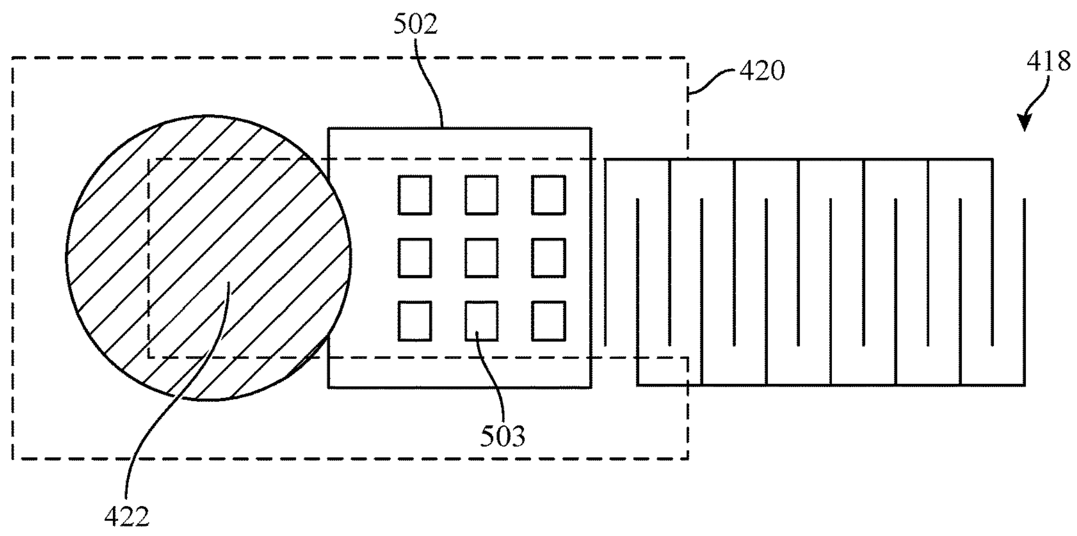
FIGS. 5A, 5B, and 5C illustrate a top view of an example capacitive element for ESD protection implemented with an absorber structure, in accordance with certain aspects of the present disclosure.
Figure 5B:
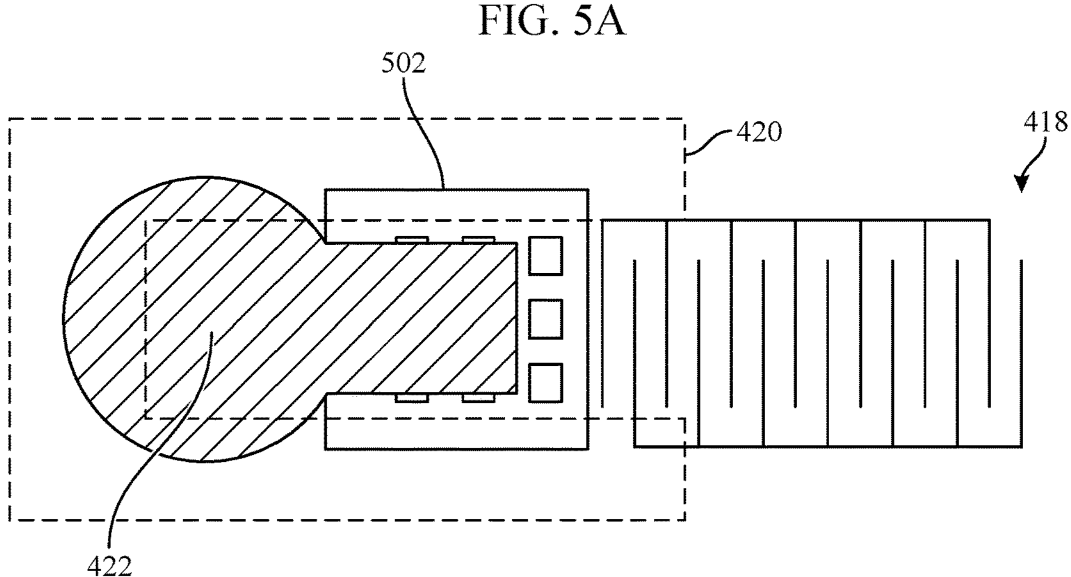
Figure 5C:
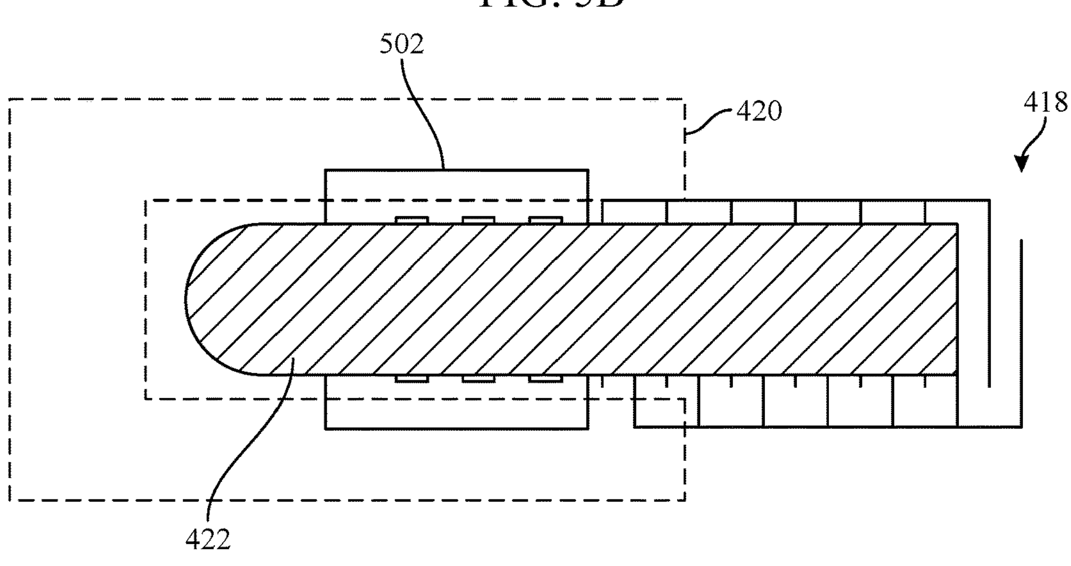

FIGS. 5A, 5B, and 5C illustrate a capacitive element 418 for ESD protection implemented with an absorber structure 502, in accordance with certain aspects of the present disclosure. FIG. 5A shows the capacitive element 418 prior to filter processing (e.g., filter manufacturing), FIG. 5B shows the capacitive element 418 during filter processing, and FIG. 5C shows the capacitive element 418 after a solder reflow process. As shown in FIG. 5A, the absorber structure 502 (and/or one or more gaps) may be implemented between the solder 422 and capacitive element 418. In some cases, during filter manufacturing, the solder 422 may at least partially melt which may short the capacitive element 418 prematurely degrading the ESD protection. As shown, the solder resist region 420 may partially surround the absorber structure 502. The absorber structure 502 (and/or any gap(s)) may allow the solder to at least partially melt without shorting the capacitive element 418, as shown in FIG. 5B. Once the solder reflow process has been completed as shown in FIG. 5C, the solder 422 shorts the capacitive element 418, as intended. An absorber structure may also be implemented for capacitive element 404 in a similar manner. The absorber structure may includes voids (e.g., void 503) for impairing the direct flow path of the solder. While FIG. 5A shows an example of an absorber structure, any suitable structure to impair the flow for solder may be used, such as an absorber structure with solder absorbing material configured implemented as meandered and tapered lines, or lines with intersections.

The fuse capacitor (e.g., capacitive element 404 or capacitive element 418 shortable via solder) allows for the usage of ESD-sensitive designs, providing benefits in filter size and cost. For instance, the general recommendation for mid-high-band (MHB) filter designs is to not use any DMS structure (ESD sensitive) directly connected at filter input/output (IO) bumps. In these cases, the DMS structure may be protected by series two-port resonators with larger size and performance constraints. Using a fuse capacitor may allow for the usage of single DMS or dual DMS structures for MHB filters without series resonators.

FIG. 6 is a flow diagram illustrating example operations 600 for device manufacturing, in accordance with certain aspects of the present disclosure. The operations 600 may be performed by a manufacturing facility, for example.

At block 602, the facility forms an electroacoustic device (e.g., filter module 400) including an acoustic resonator (e.g., DMS filter 410) and a first capacitive element (e.g., capacitive element 404). A first terminal of the first capacitive element may be coupled to a first terminal of the acoustic resonator, and a second terminal of the first capacitive element may be coupled to a first node (e.g., input node 402) of the electroacoustic device. In some aspects, first solder (e.g., solder 406, also referred to as "a first sacrificial solder") may be disposed adjacent to the first capacitive element.

At block 604, the facility may melt the first solder (e.g., solder reflow) to short the first terminal and the second terminal of the first capacitive element. In some aspects, the facility may assemble the electroacoustic device onto a board or substrate of an electronic device (e.g., a wireless device having a transceiver, such as the RF transceiver circuit 300) after forming the electroacoustic device. The first solder may be melted after the electroacoustic device is assembled onto the electronic device.

In some aspects, the first capacitive element may include an IDT. The first solder may short the fingers of the IDT.

In some aspects, the electroacoustic device may also include a second capacitive element (e.g., capacitive element 418) having a first terminal coupled to a second terminal of the acoustic resonator and a second terminal coupled to a second node (e.g., output node 414) of the electroacoustic device. Second solder (e.g., solder 422, also referred to as "a second sacrificial solder") may be disposed adjacent to the second capacitive element. The facility may also melt the second solder to short the first terminal and the second terminal of the second capacitive element.

In some aspects, the first node of the electroacoustic device may be an input node (e.g., input node 402) of the electroacoustic device. The input node may be coupled to an ASM (e.g., the ASM 392 that is part of interface 308 of FIG. 3). The second node of the electroacoustic device may include an output node (e.g., output node 414) of the electroacoustic device. The output node may be coupled to an LNA, such as the LNA 324.

In some aspects, a portion of the first solder flows over at least one of a solder absorber structure (e.g., absorber structure 502) or one or more gaps when melted to short the first terminal and the second terminal of the first capacitive element. In some aspects, a solder resist region (e.g., solder resist region 416 or 420) may be adjacent to the first solder. The solder resist region may be U-shaped with an opening facing the first capacitive element.

Example Aspects

Aspect 1: An electroacoustic device, comprising: an acoustic resonator; a first capacitive element including a first terminal coupled to a first terminal of the acoustic resonator and a second terminal coupled to a first node of the electroacoustic device; and first solder shorting the first terminal and the second terminal of the first capacitive element.

Aspect 2: The electroacoustic device of Aspect 1, wherein the acoustic resonator forms at least a portion of a double-mode surface acoustic wave (DMS) filter.

Aspect 3: The electroacoustic device of Aspect 1 or 2, wherein the first capacitive element comprises an interdigital transducer (IDT), wherein the first solder shorts fingers of the IDT.

Aspect 4: The electroacoustic device according to any of Aspects 1-3, further comprising: a second capacitive element including a first terminal coupled to a second terminal of the acoustic resonator and a second terminal coupled to a second node of the electroacoustic device; and second solder shorting the first terminal and the second terminal of the second capacitive element.

Aspect 5: The electroacoustic device of Aspect 4, wherein: the first node of the electroacoustic device comprises an input node of the electroacoustic device; and the second node of the electroacoustic device comprises an output node of the electroacoustic device.

Aspect 6: The electroacoustic device according to any of Aspects 1-5, further comprising a solder absorber structure adjacent to the first capacitive element and below the first solder.

Aspect 7: The electroacoustic device according to any of Aspects 1-6, further comprising a solder resist region adjacent to the first solder.

Aspect 8: The electroacoustic device of Aspect 7, wherein the solder resist region is U-shaped with an opening facing the first capacitive element.

Aspect 9: A method for device manufacturing, comprising: forming an electroacoustic device comprising an acoustic resonator and a first capacitive element, wherein a first terminal of the first capacitive element is coupled to a first terminal of the acoustic resonator and a second terminal of the first capacitive element is coupled to a first node of the electroacoustic device, wherein first solder is disposed adjacent to the first capacitive element; and melting the first solder to short the first terminal and the second terminal of the first capacitive element.

Aspect 10: The method of Aspect 9, further comprising assembling the electroacoustic device in an electronic device after forming the electroacoustic device, wherein the first solder is melted after the electroacoustic device is assembled in the electronic device.

Aspect 11: The method of Aspect 9 or 10, wherein the acoustic resonator forms at least a portion of a double-mode surface acoustic wave (DMS) filter.

Aspect 12: The method according to any of Aspects 9-11, wherein the first capacitive element comprises an interdigital transducer (IDT) and wherein melting the first solder shorts fingers of the IDT.

Aspect 13: The method according to any of Aspects 9-12, wherein: the electroacoustic device further comprises: a second capacitive element including a first terminal coupled to a second terminal of the acoustic resonator and a second terminal coupled to a second node of the electroacoustic device; and second solder adjacent to the second capacitive element; and the method further comprises melting the second solder to short the first terminal and the second terminal of the second capacitive element.

Aspect 14: The method of Aspect 13, wherein: the first node of the electroacoustic device comprises an input node of the electroacoustic device; and the second node of the electroacoustic device comprises an output node of the electroacoustic device.

Aspect 15: The method according to any of Aspects 9-14, wherein a portion of the first solder flows over a solder absorber structure when melted to short the first terminal and the second terminal of the first capacitive element.

Aspect 16: The method according to any of Aspects 9-15, further comprising a solder resist region adjacent to the first solder.

Aspect 17: The method of Aspect 16, wherein the solder resist region is U-shaped with an opening facing the first capacitive element.

Aspect 18: An apparatus for wireless communication, comprising: an amplifier; an antenna switch module (ASM); and an acoustic filter coupled between the amplifier and the ASM, wherein the acoustic filter comprises: an acoustic resonator; a first capacitive element including a first terminal coupled to a first terminal of the acoustic resonator and a second terminal coupled to a first node of the acoustic filter, the first node being coupled to the amplifier or the ASM; and first solder shorting the first terminal and the second terminal of the first capacitive element.

Aspect 19: The apparatus of Aspect 18, wherein the acoustic filter further comprises: a second capacitive element including a first terminal coupled to a second terminal of the acoustic resonator and a second terminal coupled to a second node of the acoustic filter; and second solder shorting the first terminal and the second terminal of the second capacitive element.

Aspect 20: The apparatus of Aspect 19, wherein: the first node of the acoustic filter comprises an input node of the acoustic filter coupled to the ASM; and the second node of the acoustic filter comprises an output node of the acoustic filter coupled to the amplifier.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An electroacoustic device, comprising:

an acoustic resonator;

a first capacitive element including a first terminal coupled to a first terminal of the acoustic resonator and a second terminal coupled to a first node of the electroacoustic device; and first solder shorting the first terminal and the second terminal of the first capacitive element.

2. The electroacoustic device of claim 1, wherein the acoustic resonator forms at least a portion of a double-mode surface acoustic wave (DMS) filter.

3. The electroacoustic device of claim 1, wherein the first capacitive element comprises an interdigital transducer (IDT), wherein the first solder shorts fingers of the IDT.

4. The electroacoustic device of claim 1, further comprising:

a second capacitive element including a first terminal coupled to a second terminal of the acoustic resonator and a second terminal coupled to a second node of the electroacoustic device; and second solder shorting the first terminal and the second terminal of the second capacitive element.

5. The electroacoustic device of claim 4, wherein:

the first node of the electroacoustic device comprises an input node of the electroacoustic device; and the second node of the electroacoustic device comprises an output node of the electroacoustic device.

6. The electroacoustic device of claim 1, further comprising a solder absorber structure adjacent to the first capacitive element and below the first solder.

7. The electroacoustic device of claim 1, further comprising a solder resist region adjacent to the first solder.

8. The electroacoustic device of claim 7, wherein the solder resist region is U-shaped with an opening facing the first capacitive element.

9. A method for device manufacturing, comprising:

forming an electroacoustic device comprising an acoustic resonator and a first capacitive element, wherein a first terminal of the first capacitive element is coupled to a first terminal of the acoustic resonator and a second terminal of the first capacitive element is coupled to a first node of the electroacoustic device, wherein first solder is disposed adjacent to the first capacitive element; and melting the first solder to short the first terminal and the second terminal of the first capacitive element.

10. The method of claim 9, further comprising assembling the electroacoustic device in an electronic device after forming the electroacoustic device, wherein the first solder is melted after the electroacoustic device is assembled in the electronic device.

11. The method of claim 9, wherein the acoustic resonator forms at least a portion of a double-mode surface acoustic wave (DMS) filter.

12. The method of claim 9, wherein the first capacitive element comprises an interdigital transducer (IDT) and wherein melting the first solder shorts fingers of the IDT.

13. The method of claim 9, wherein:

the electroacoustic device further comprises:

a second capacitive element including a first terminal coupled to a second terminal of the acoustic resonator and a second terminal coupled to a second node of the electroacoustic device; and second solder adjacent to the second capacitive element; and the method further comprises melting the second solder to short the first terminal and the second terminal of the second capacitive element.

14. The method of claim 13, wherein:

the first node of the electroacoustic device comprises an input node of the electroacoustic device; and the second node of the electroacoustic device comprises an output node of the electroacoustic device.

15. The method of claim 9, wherein a portion of the first solder flows over a solder absorber structure when melted to short the first terminal and the second terminal of the first capacitive element.

16. The method of claim 9, further comprising a solder resist region adjacent to the first solder.

17. The method of claim 16, wherein the solder resist region is U-shaped with an opening facing the first capacitive element.

18. An apparatus for wireless communication, comprising:

an amplifier;

an antenna switch module (ASM); and an acoustic filter coupled between the amplifier and the ASM, wherein the acoustic filter comprises:

an acoustic resonator;

a first capacitive element including a first terminal coupled to a first terminal of the acoustic resonator and a second terminal coupled to a first node of the acoustic filter, the first node being coupled to the amplifier or the ASM; and first solder shorting the first terminal and the second terminal of the first capacitive element.

19. The apparatus of claim 18, wherein the acoustic filter further comprises:

a second capacitive element including a first terminal coupled to a second terminal of the acoustic resonator and a second terminal coupled to a second node of the acoustic filter; and second solder shorting the first terminal and the second terminal of the second capacitive element.

20. The apparatus of claim 19, wherein:

the first node of the acoustic filter comprises an input node of the acoustic filter coupled to the ASM; and the second node of the acoustic filter comprises an output node of the acoustic filter coupled to the amplifier.

* * * * *